United States Patent
Chang et al.

(10) Patent No.: US 8,367,485 B2
(45) Date of Patent: Feb. 5, 2013

(54) EMBEDDED SILICON GERMANIUM N-TYPE FILED EFFECT TRANSISTOR FOR REDUCED FLOATING BODY EFFECT

(75) Inventors: Leland Chang, New York, NY (US); Isaac Lauer, White Plains, NY (US); Chung-Hsun Lin, White Plains, NY (US); Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 173 days.

(21) Appl. No.: 12/551,941

(22) Filed: Sep. 1, 2009

(65) Prior Publication Data

US 2011/0049627 A1  Mar. 3, 2011

(51) Int. Cl.
*H01L 21/84* (2006.01)

(52) U.S. Cl. ............... 438/151; 438/286; 257/E21.415; 257/E21.704

(58) Field of Classification Search .................. 257/347; 438/151, 286
See application file for complete search history.

(56) References Cited

U.S. PATENT DOCUMENTS

| | | | |
|---|---|---|---|
| 6,642,566 B1 | 11/2003 | Mandelman et al. | |
| 6,660,581 B1 | 12/2003 | Yang et al. | |
| 6,661,049 B2 | 12/2003 | Tzeng et al. | |
| 6,686,248 B1 | 2/2004 | Yu | |
| 6,790,750 B1 | 9/2004 | Long et al. | |
| 7,145,196 B2 | 12/2006 | Hur et al. | |
| 7,309,660 B2 | 12/2007 | Chen | |
| 7,368,358 B2 | 5/2008 | Ouyang et al. | |
| 7,723,174 B2 * | 5/2010 | Waite et al. | 438/216 |
| 2004/0173847 A1 | 9/2004 | Adkisson et al. | |
| 2005/0064687 A1 * | 3/2005 | Chidambarrao et al. | 438/581 |
| 2006/0086987 A1 | 4/2006 | Chen et al. | |
| 2006/0099745 A1 * | 5/2006 | Hsu et al. | 438/149 |
| 2006/0289856 A1 * | 12/2006 | Shimamune et al. | 257/19 |
| 2007/0018252 A1 | 1/2007 | Zhu | |
| 2007/0096149 A1 * | 5/2007 | Liu et al. | 257/192 |
| 2007/0122955 A1 | 5/2007 | Luo et al. | |
| 2007/0128786 A1 * | 6/2007 | Cheng et al. | 438/199 |
| 2007/0138592 A1 | 6/2007 | Chang et al. | |
| 2007/0164364 A1 * | 7/2007 | Kawasaki | 257/368 |
| 2007/0181977 A1 * | 8/2007 | Lochtefeld et al. | 257/618 |
| 2007/0202641 A1 | 8/2007 | Wei et al. | |
| 2007/0249112 A1 * | 10/2007 | Geene et al. | 438/199 |

(Continued)

OTHER PUBLICATIONS

Chung-Hsun, Lin, et al., Non-Final Office Action mailed Jan. 4, 2011, U.S. Appl. No. 12/551,804, filed Sep. 1, 2009.

(Continued)

*Primary Examiner* — A. Sefer
(74) *Attorney, Agent, or Firm* — Jose Gutman; Fleit Gibbons Gutman Bongini & Bianco PL

(57) ABSTRACT

A method for fabricating a semiconductor device includes forming a gate stack on an active region of a silicon-on-insulator substrate. The active region is within a semiconductor layer and is doped with an p-type dopant. A gate spacer is formed surrounding the gate stack. A first trench is formed in a region reserved for a source region and a second trench is formed in a region reserved for a drain region. The first and second trenches are formed while maintaining exposed the region reserved for the source region and the region reserved for the drain region. Silicon germanium is epitaxially grown within the first trench and the second trench while maintaining exposed the regions reserved for the source and drain regions, respectively.

5 Claims, 14 Drawing Sheets

U.S. PATENT DOCUMENTS

| | | | |
|---|---|---|---|
| 2008/0119019 A1* | 5/2008 | Han et al. | 438/197 |
| 2008/0122011 A1* | 5/2008 | Wu | 257/392 |
| 2008/0124874 A1* | 5/2008 | Park et al. | 438/285 |
| 2009/0093095 A1* | 4/2009 | Obradovic et al. | 438/231 |
| 2009/0258463 A1* | 10/2009 | Kim et al. | 438/142 |
| 2010/0155727 A1* | 6/2010 | Mowry et al. | 257/48 |
| 2010/0224938 A1* | 9/2010 | Zhu | 257/369 |
| 2011/0049626 A1 | 3/2011 | Lin et al. | |

OTHER PUBLICATIONS

Hsiao, et al., "Source/Drain Engineering with Ge Large Angle Tilt Implantation and Pre-Amorphization to Improve Current Drive and Alleviate Floating Body Effects of Thin Film SOI MOSFET", Proceedings of the 27$^{th}$ European Solid State Device Research Conference, pp. 516-519, 1997.

Final Rejection dated Apr. 19, 2011 for U.S. Appl. No. 12/551,804.

U.S. Appl. No. 12/551,804, filed Sep. 1, 2009, Lin et al.

Zhang, D., et al., "Characteristic Study of SOI SGe Technology," Proceedings 2007 IEEE International SOI Conference, Oct. 1-4, 2007, Indian Wells, California, pp. 21-22'; ISBN: 1-4244-0879-2; Material Identity No. YXA7-1900-173.

Ang, K.W., et al., "Strained N-Channel Transistors wth Silicon Source and Drain Regions and Embedded Silicon/Germanium as Strain-Transfer Structure," IEEE Electron Device Letters, vol. 28, pp. 609-612, 2007.

Ang, K.W., et al., "Beneath-The-Channel Strain-Transfer-Structure (STS) and En Source/Drain Stressors for Strain and Performance Enhancement Nanoscale MOSFETs," 2007 IEEE Symposium on VLSI Technology, pp. 42-43, Jun. 12-14, 2007, Kyoto, Japan; ISBN: 978-4-900784-03-1; Material Identity No. YXA8-1900-151.

Wang, G.H., et al., "Uniaxial Strained Silicon n-FETs on Silicon-Germanium-on-Insulator Substrates with an e-SiGe Stress Transfer Layer and Source/Drain Stressors for Performance Enhangement," Proceedings of the 37$^{th}$ European Solid-State Device Research Conference, pp. 311-314; Sep. 11-13, 2007; Munich, Germany, ISBN: 978-1-4244-1123-8; Material Identity No. YXA8-1900-206.

Donaton, R.A., et al., "Design and Fabrication of MOSFETs with a Reverse Embedded SiGe (Rev. eSiGe) Structure," 2006 International Electron Device Meeting (IEEE Cat. No. 06CH37807C); Dec. 11-13, 2006; Washington, D.C., ISBN: 142440438X; Material Identity No. XX-2007-00720.

Non-Final Rejection dated Sep. 20, 2011 for U.S. Appl. No. 12/551,804.

* cited by examiner

EMBEDDED SILICON GERMANIUM N-TYPE FILED EFFECT TRANSISTOR FOR REDUCED FLOATING BODY EFFECT

FIELD OF THE INVENTION

The present invention generally relates to the field of semiconductors, and more particularly relates to embedded silicon germanium n-type field effect transistors.

BACKGROUND OF THE INVENTION

Management of floating body effects in silicon-on-insulator (SOI) transistors is becoming increasingly important with scaling, as the variation in the floating body effect becomes a larger proportion of the total device variation. The floating body effect is specific to transistors formed on substrates having an insulator layer. In particular, the neutral floating body is electrically isolated by source/drain and halo extension regions that form oppositely poled diode junctions at the ends of the transistor conduction channel and floating body, while the gate electrode is insulated from the conduction channel through a dielectric. The insulator layer in the substrate completes insulation of the conduction channel and thus prevents discharge of any charge that may develop in the floating body. Charge injection into the neutral body when the transistor is not conducting develops voltages in the conduction channel in accordance with the source and drain diode characteristics.

The floating body effect is induced by the excess carriers generated by hot electrons near the gradient drain region, resulting in the enhancement in the body potential in SOI devices. It induces a threshold voltage reduction, resulting in a kink in output characteristics. The voltage developed due to charge collection in the transistor conduction channel has the effect of altering the switching threshold of the transistor. This effect, in turn, alters the signal timing and signal propagation speed, since any transistor will have a finite slew rate and the rise and fall time of signals is not instantaneous even when gate capacitance is very small. SOI switching circuits, in particular, suffer from severe dynamic floating body effects such as hysteresis and history effects. The onset of the kink effect in SOI switching circuits strongly depends on operating frequency, and produces Lorentzian-like noise overshoot and harmonic distortion.

One solution to the floating body effect in NFETs is to place body ties on every NFET. Although this solution is generally effective, it consumes considerable layout area.

SUMMARY OF THE INVENTION

In one embodiment, a method for fabricating a semiconductor device is disclosed. The method comprises forming a gate stack on an active region of a silicon-on-insulator substrate. The active region is within a semiconductor layer and is doped with an p-type dopant. A gate spacer is formed over the gate stack. A first trench is formed in a region reserved for a source region and a second trench is formed in a region reserved for a drain region. The first and second trenches are formed while maintaining exposed the region reserved for the source region and the region reserved for the drain region. Silicon germanium is epitaxially grown within the first trench and the second trench while maintaining exposed the regions reserved for the source and drain regions, respectively.

In another embodiment, a semiconductor device is disclosed. The semiconductor device includes a gate stack formed on an active region of a silicon-on-insulator substrate. The active region is doped with an n-type dopant. A gate spacer is formed surrounding the gate stack. A source region is formed within the semiconductor layer comprising embedded silicon germanium (hereinafter also abbreviated "eSiGe"). A drain region is formed within the semiconductor layer comprising eSiGe.

In another embodiment, a method for fabricating a semiconductor device is disclosed. The method comprises forming a gate stack on an active region of a silicon-on-insulator substrate. The active region is within a semiconductor layer and is doped with an p-type dopant. A differential spacer is formed over the gate stack. The differential spacer comprises at least one dimension that is greater than a corresponding dimension of a gate spacer formed on a corresponding p-type field effect transistor. A first trench is formed in a region reserved for a source region and a second trench is formed in a region reserved for a drain region. The first and second trenches are formed while maintaining exposed the region reserved for the source region and the region reserved for the drain region. Silicon germanium is epitaxially grown within the first trench and the second trench while maintaining exposed the regions reserved for the source and drain regions, respectively.

In yet another embodiment, a method for fabricating a semiconductor device is disclosed. The method comprises forming a gate stack on an active region of a silicon-on-insulator substrate. The active region is within a semiconductor layer and is doped with an p-type dopant. A gate spacer is formed over the gate stack. A first trench is formed in a region reserved for a source region and a second trench is formed in a region reserved for a drain region. The first and second trenches are formed while maintaining exposed the region reserved for the source region and the region reserved for the drain region. Silicon germanium is epitaxially grown within the first trench and the second trench while maintaining exposed the regions reserved for the source and drain regions, respectively.

An implantation mask is formed over a corresponding p-type field effect transistor. An amorphizing species is implanted within the silicon germanium grown in the first trench and the silicon germanium grown in the second trench.

DETAILED DESCRIPTION

As required, detailed embodiments of the present invention are disclosed herein; however, it is to be understood that the disclosed embodiments are merely examples of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure and function. Further, the terms and phrases used herein are not intended to be limiting; but rather, to provide an understandable description of the invention.

The terms "a" or "an", as used herein, are defined as one or more than one. The term plurality, as used herein, is defined as two or more than two. In general, unless otherwise indicated, singular elements may be in the plural and vice versa with no loss of generality. The term another, as used herein, is defined as at least a second or more. The terms including and/or having, as used herein, are defined as comprising (i.e., open language). The term coupled, as used herein, is defined as connected, although not necessarily directly, and not necessarily mechanically.

Various embodiments of the present invention provide an eSiGe NFET with a reduced floating body effect. In particular, the various embodiments provide an eSiGe NFET that incorporates an eSiGe source/drain while minimizing the impact from the stress. In one or more embodiments, the NFET regions and PFET regions are exposed during the eSiGe trench etching process and eSiGe is grown within the NFET and PFET source/drain diffusion regions. The SiGe/body junction reduces the floating body effects such as variability and drain-induced barrier lowering (DIBL). In addition, other embodiments reduce the proximity and total volume of the eSiGe to NFET device channel. This reduces NFET current/mobility degradation. One or more embodiments, mask the PFET regions and apply an amorphizing implant (typically, but not limited to, greater than a $1e^{15}$ cm$^3$ dose) of germanium, argon, or xenon to relax eSiGe stress in NFET regions. This improves channel mobility and drive current.

Figure 1:
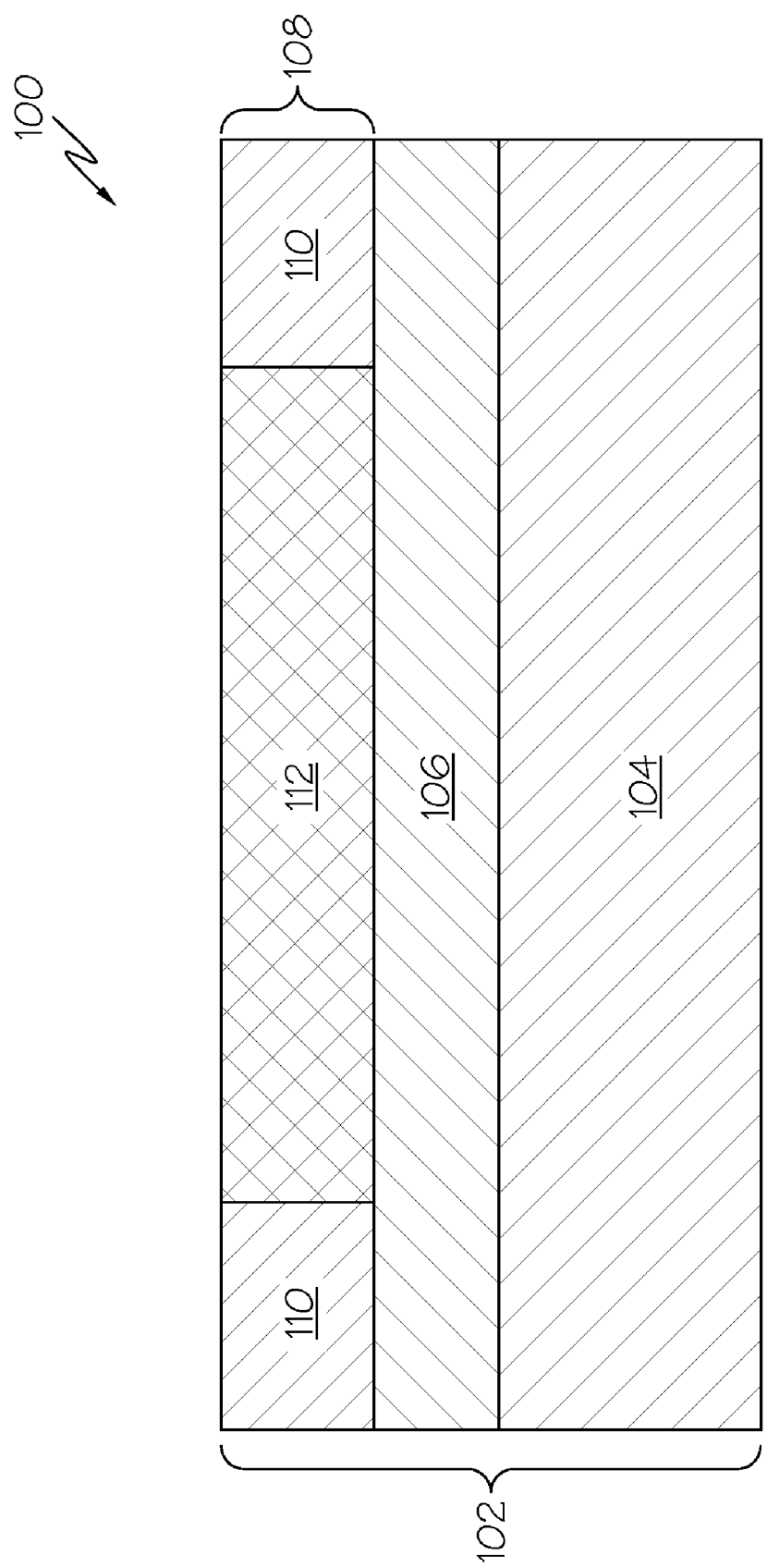
FIGS. 1-6 are cross-sectional views showing various fabrication processes of an eSiGe NFET according to one embodiment of the present invention.

FIGS. 1-11 show various fabrication processes for an eSiGe NFET device 100 according to one or more embodiments of the present invention. As shown in FIG. 1, an SOI substrate 102 is provided. The SOI substrate 102 is formed by a handle substrate 104 (e.g., a silicon substrate), an overlying buried insulator layer 106 (e.g., an oxide layer), and an overlying semiconductor layer 108. A shallow trench isolation region 110 of a dielectric material is formed in the semiconductor layer 108. The shallow trench isolation region 110 abuts the buried insulator layer 106 and laterally surrounds an active region 112 in the semiconductor layer 108, so as to electrically isolate the active region 112 from other portions of the semiconductor layer 108 (e.g., other active regions).

In one embodiment, the active region 112 comprises a single crystalline semiconductor material, such as silicon, germanium, a silicon-germanium alloy, a silicon-carbon alloy, a silicon-germanium-carbon alloy, gallium arsenide, indium arsenide, indium phosphide, a III-V compound semiconductor material, a II-VI compound semiconductor material, or an organic semiconductor material. In this embodiment, the semiconductor material comprises silicon. The active region 112 of this embodiment is doped with an p-type dopant (e.g., boron, gallium, indium, or the like). Non-electrical stress-generating dopants, such as germanium and carbon may also be present.

Figure 2:
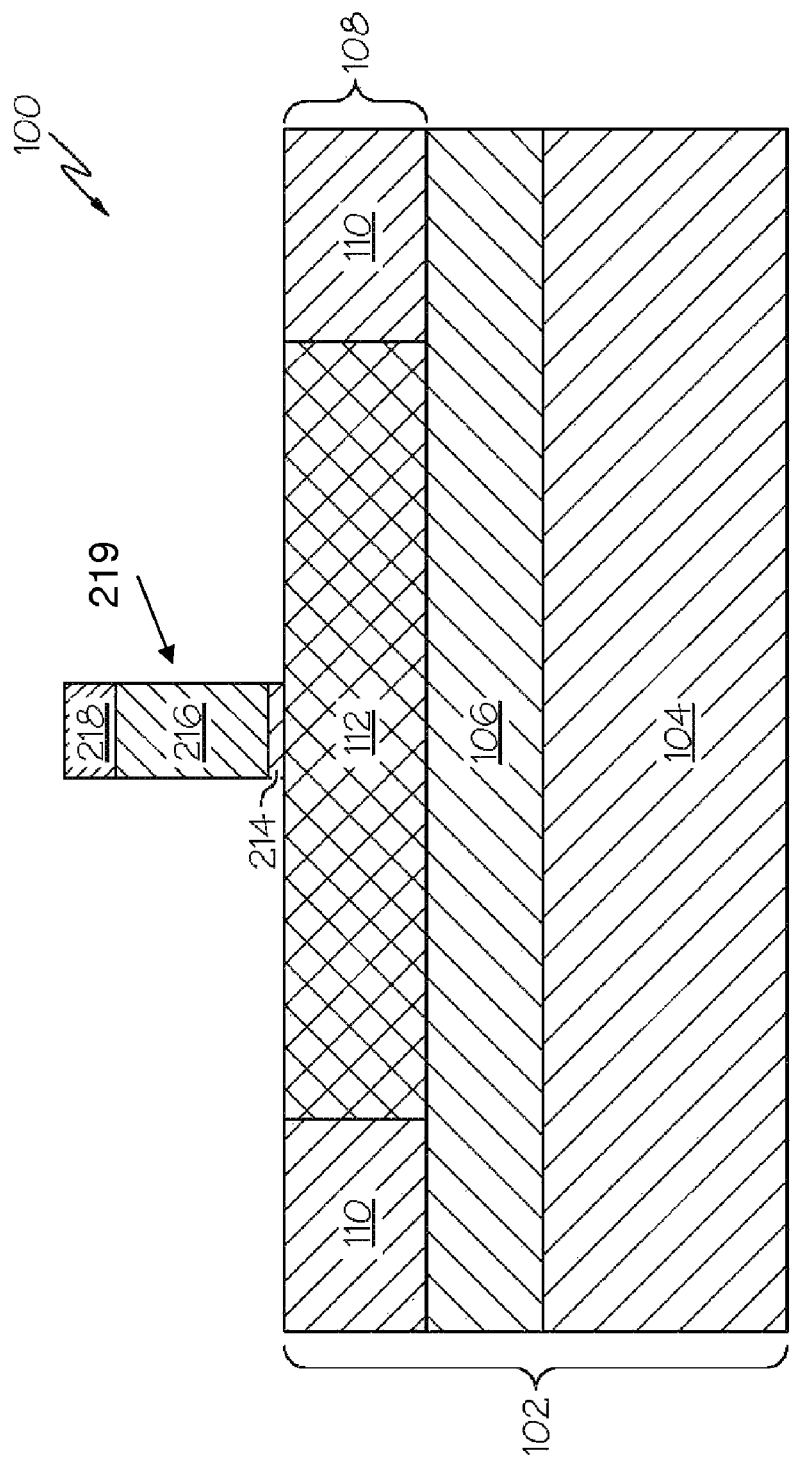

As shown in FIG. 2, a gate dielectric 214 and a gate conductor 216 are formed on the active region 112. More specifically, a stack of a gate dielectric layer and a gate conductor layer are formed on the active region 112. This stack is then lithographically patterned and etched to form the gate dielectric 214 and the overlying gate conductor 216 in a portion of the active region 112 of the semiconductor layer 108.

The gate dielectric 214 of this embodiment comprises a conventional dielectric material (such as silicon oxide, silicon nitride, silicon oxynitride, or a stack thereof) that is formed by thermal conversion of a top portion of the active region 112 and/or by chemical vapor deposition ("CVD"). In alternative embodiments, the gate dielectric 214 comprises a high-k dielectric material (such as hafnium oxide, zirconium oxide, lanthanum oxide, aluminum oxide, titanium dioxide, strontium titanate, lanthanum aluminate, yttrium oxide, an alloy thereof, or a silicate thereof) that is formed in a known manner (such as by CVD, atomic layer deposition ("ALD"), molecular beam epitaxy ("MBE"), pulsed laser deposition ("PLD"), liquid source misted chemical deposition ("LSMCD"), or physical vapor deposition ("PVD").

The gate conductor 216 comprises a semiconductor (e.g., polysilicon) gate layer and/or a metal gate layer. In one embodiment in which the gate dielectric 214 comprises a conventional dielectric material, the gate conductor 216 is a semiconductor gate layer. In one embodiment in which the gate dielectric comprises a high-k dielectric material, the gate conductor 216 is a metal gate layer abutting the gate dielectric 214 and comprises a conductive refractory metal nitride (such as TaN, TiN, WN, TiAlN, TaCN, or an alloy thereof). In another embodiment, the gate conductor 216 comprises a stack of a metal gate layer and a semiconductor gate layer. Also, a gate polysilicon cap 218 can be deposited on the gate conductor layer 216, such as through low-pressure chemical vapor deposition (LPCVD) or silicon sputtering. In one embodiment, a gate stack 219 comprises the gate dielectric 214, the gate conductor 216, and the gate polysilicon cap 218.

Figure 3:
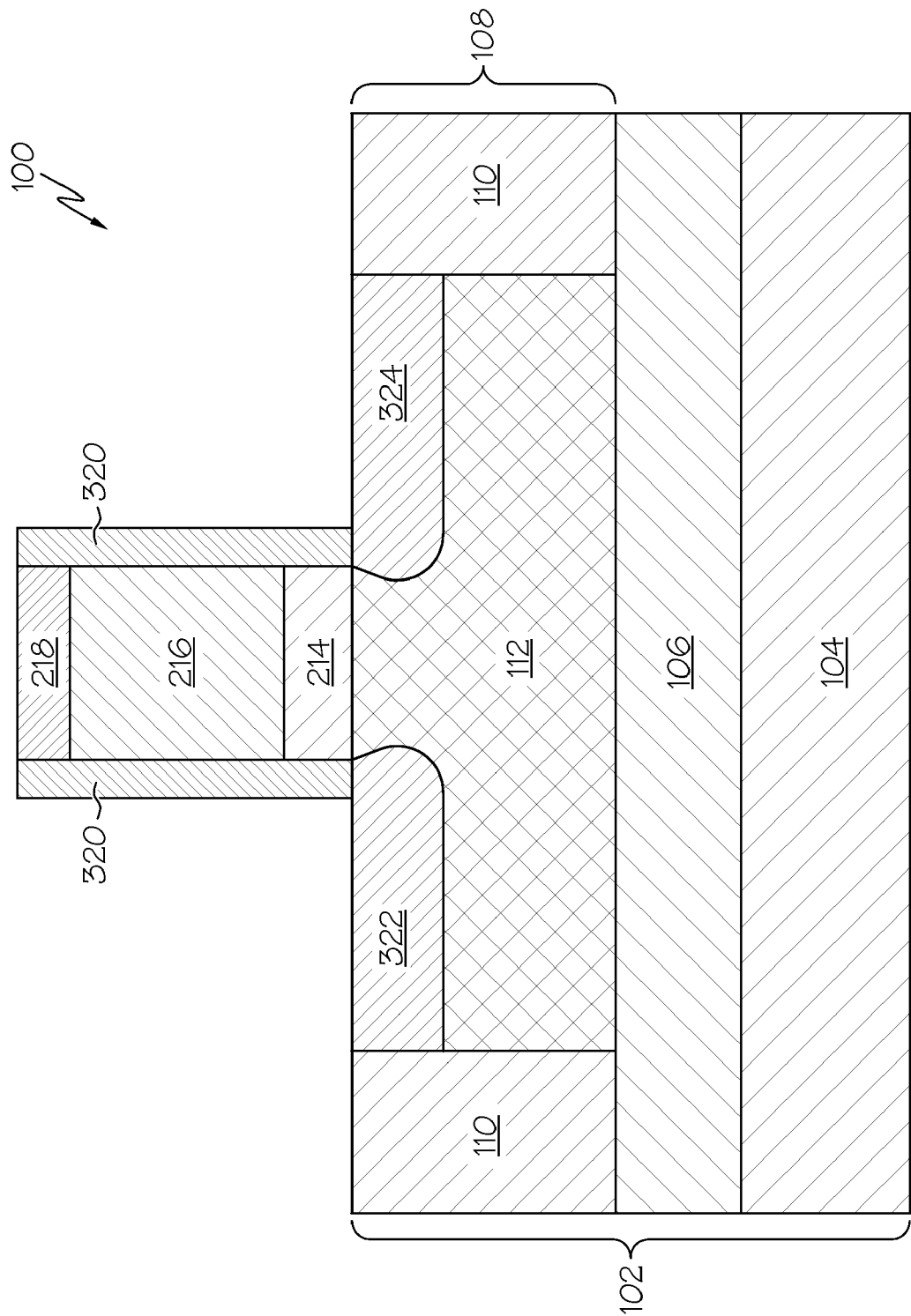

A first gate spacer layer 320 comprising a dielectric material (such as silicon oxide) is then formed on the gate stack 219 and on the semiconductor layer 108. Alternatively, as shown in FIG. 3, a reactive-ion etch process can be used to remove the dielectric material on top of the stack 219 and on the semiconductor layer 108 to form the first gate spacer layer 320 only on the sidewall of the gate stack 219. Ion implantations are performed into the semiconductor layer 108 employing the gate stack 219 as an implantation mask in order to form a source extension region 322 and a drain extension region 324.

The source extension region 322 and the drain extension region 324 are formed in the semiconductor layer 108 at the same time. This ion implantation to form the extension regions can be performed before or after the formation of the first gate spacer layer 320, or alternatively formation of the first gate spacer layer 320 can be omitted. If the ion implantation follows formation of the first gate spacer layer 320, the vertical portions of the first gate spacer layer 320 on the sidewalls of the gate stack 219 also serve as an implantation mask.

Figure 4:
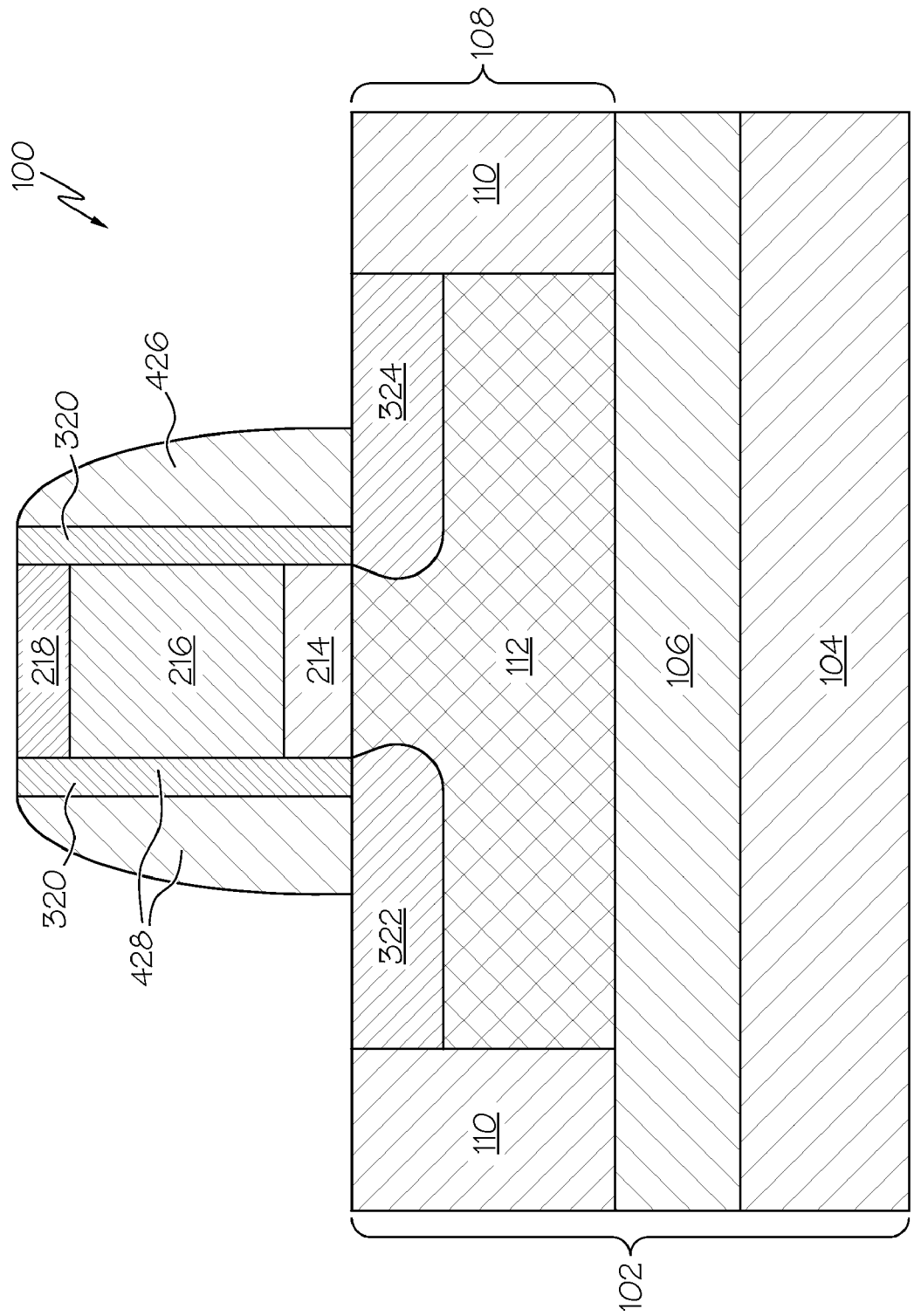

As shown in FIG. 4, a second gate spacer layer 426 is deposited on the first gate spacer layer 320, and then these two layers are etched (e.g., using reactive ion etching) to form a gate spacer 428. The gate spacer 428 comprises a combination of the first gate spacer layer 320 and the second gate spacer layer 426. In exemplary embodiments, the second gate spacer layer 426 comprises a dielectric material that can be the same as or can be different from the dielectric material of the first gate spacer layer 320. For example, in one embodiment, the first gate spacer layer 320 comprises silicon oxide and the second gate spacer layer 426 comprises silicon nitride. The dielectric materials for the first and second gate spacer layer portions may include low-k dielectric materials. A portion (not shown) of the first gate spacer layer 320 outside the outer sidewalls of the second gate spacer layer 426 is removed during the reactive ion etching. Thus, the gate spacer 428 laterally abuts the sidewalls of the gate conductor 216 and the gate dielectric 214, and abuts the source extension region 322 and the drain extension region 324.

Figure 5:
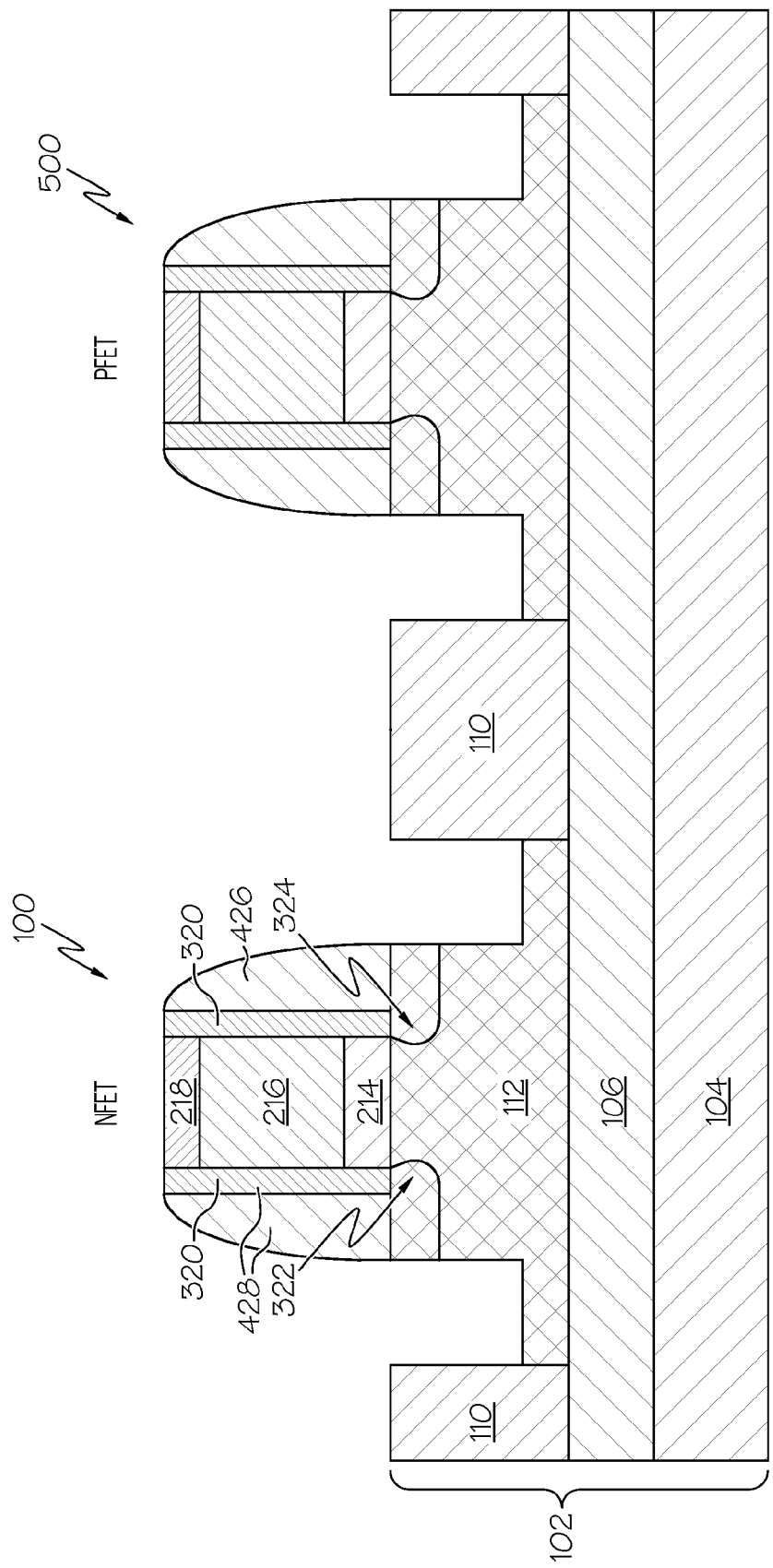

It should be noted that a corresponding PFET device 500 can be fabricated using processes similar to those discussed above. Trenches 530, 532 are then lithographically patterned, for example by reactive ion etching (RIE), into the active region 112 between the shallow trench isolation regions 110 and the gate spacer 428 as shown in FIG. 5. Such a process is also performed for the PFET device 500. As can be seen, whereas conventional methods generally mask the NFET 100 from the trench etch process and only perform these processes on the PFET 500, one or more of the embodiments of the present invention expose both the NFET 100 and the PFET 500 during the trench etch process, thereby creating the trenches 530, 532 therein.

Figure 6:
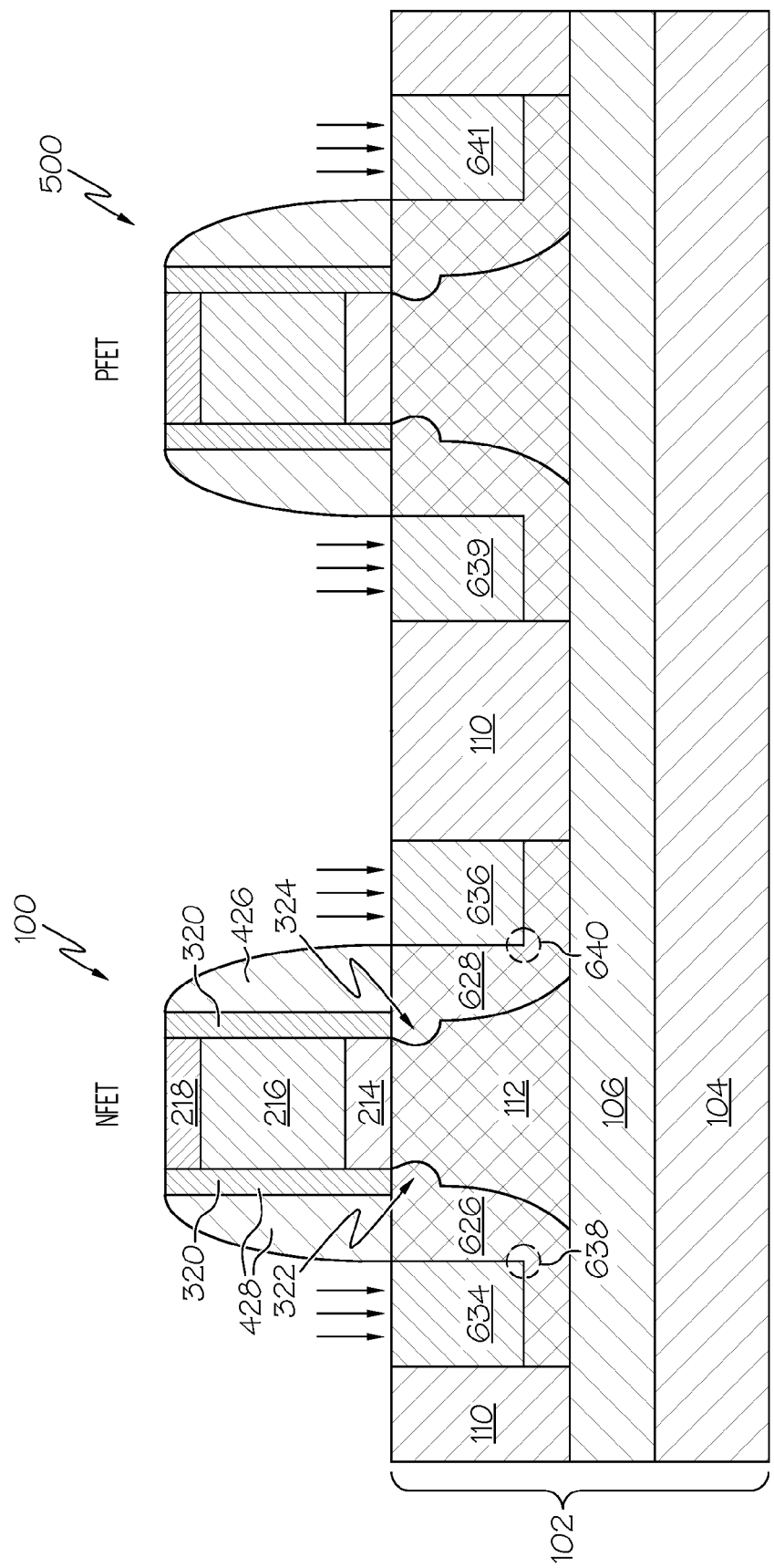

Embedded SiGe regions 634, 636 are then created in these trenches 530, 532, as shown in FIG. 6. In particular, the embedded SiGe 634, 636 can be formed in the trenches 530, 532 by epitaxially growing the SiGe from the silicon exposed within the trenches 530, 532. FIG. 6 shows the corresponding PFET device 500 comprising embedded SiGe 639, 641 as well.

In one embodiment, the process of epitaxially growing the SiGe comprises a selective epitaxy process, which grows silicon germanium on the exposed silicon surface within the active region 112, but does not grow silicon germanium on dielectric layers, such as nitride or oxide. Also, this epitaxial process can be performed in the presence of an appropriate dopant impurity (such as in situ doping of boron), such that the SiGe grows with the dopant included therein, without there being a need to implant additional dopants later in subsequent processing. It should be noted that any appropriate impurity and not just boron can be used. Next, vertical implantation is performed for defining source/drain regions 626, 628 within the NFET portion of the substrate 102 and for defining a NFET device channel and the same is done for the PFET device 500.

The eSiGe creates eSiGe/body junctions 638, 640 between the source region 626 and the active region 112 and between the drain region 628 and the active region 112. These eSiGE/body junctions 638, 640 reduce floating body effects such as variability and drain induced barrier lowering (DIBL) by providing larger junction current. However, the formation of eSiGe can create compressive stress on the underlying layers, i.e., the source region 626, the drain region 628, and the active region 112, which can degrade the performance of the NFET device 100. Therefore, in another embodiment, during/after the gate spacer 428 formation, but prior to the trench etching process discussed above with respect to FIG. 5 a differential spacer formation process is performed.

Figure 7:
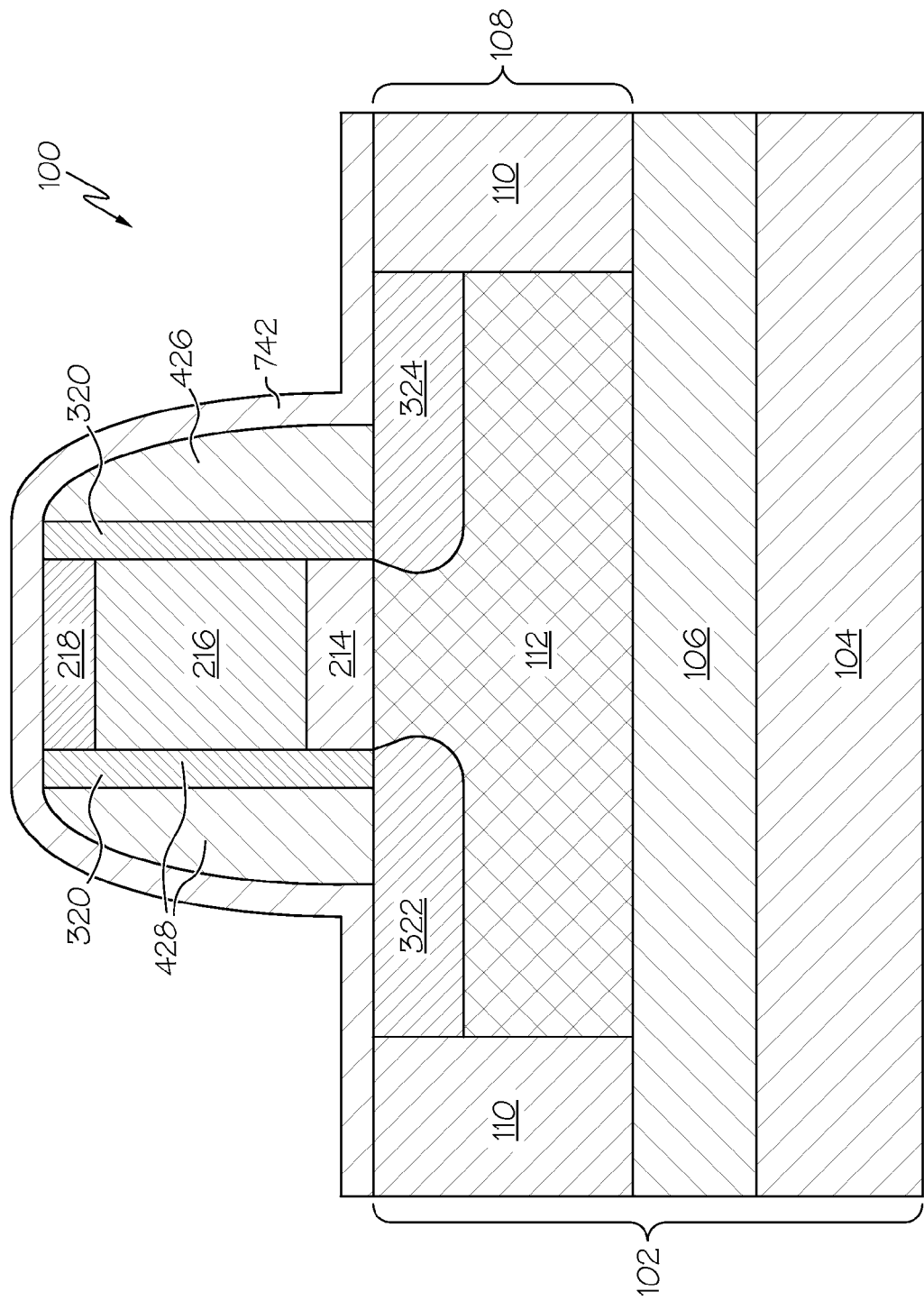
FIG. 7 shows a cross-sectional view of a fabrication process of an NFET where a differential spacer layer has been formed over the gate spacer and upper portions of the overlying semiconductor layer of the NFET according to one embodiment of the present invention.
Figure 8:
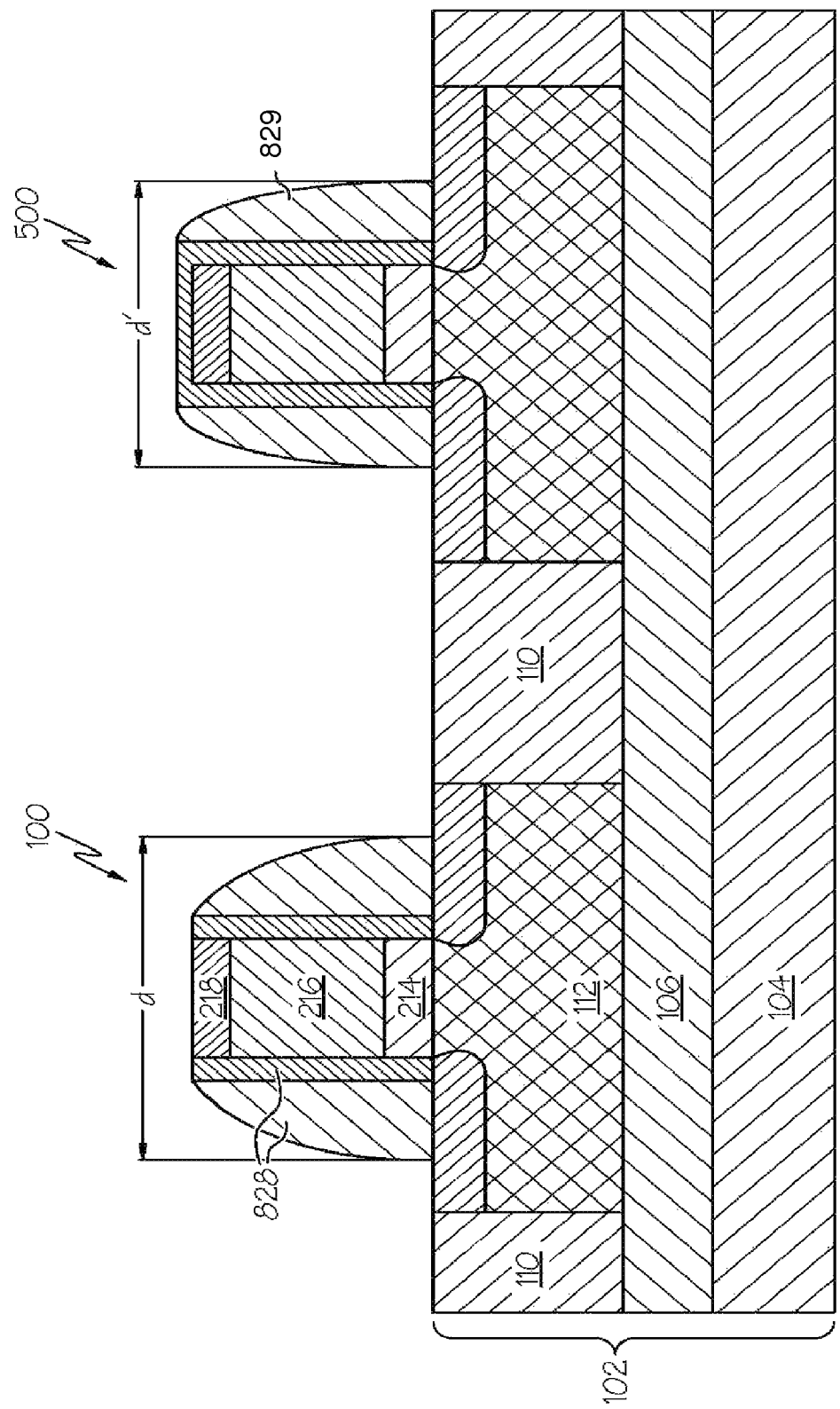
FIG. 8 shows a cross-sectional view of an NFET and a PFET where the NFET comprises a differential spacer layer with respect to the PFET according to one embodiment of the present invention.

For example, during the gate spacer 428 formation process discussed above with respect to FIGS. 3 and 4, the first gate spacer layer 320 and the second gate spacer layer 426 are etched such that the gate spacer 428 comprises at least one dimension (such as, but not limited to, thickness, width, or the like) that is different than at least one corresponding dimension of the gate spacer of the PFET 500. In other words, the gate spacer 428 becomes a differential (different than) spacer with respect to the gate spacer of the PFET 500. In an alternative embodiment, as shown in FIG. 7, an additional spacer layer 742 can be deposited over the gate spacer 428 to create a differential spacer and then etched back. In other words, the additional spacer layer 742 results in the gate spacer 428 having a greater dimension than the gate spacer of the PFET 500. This additional spacer 742 can comprise the same material or different material as the second spacer layer 426, As can be seen in FIG. 8, the dimension d of the NFET differential gate spacer 828 is greater than the dimension d' of the PFET gate spacer 829.

Figure 9:
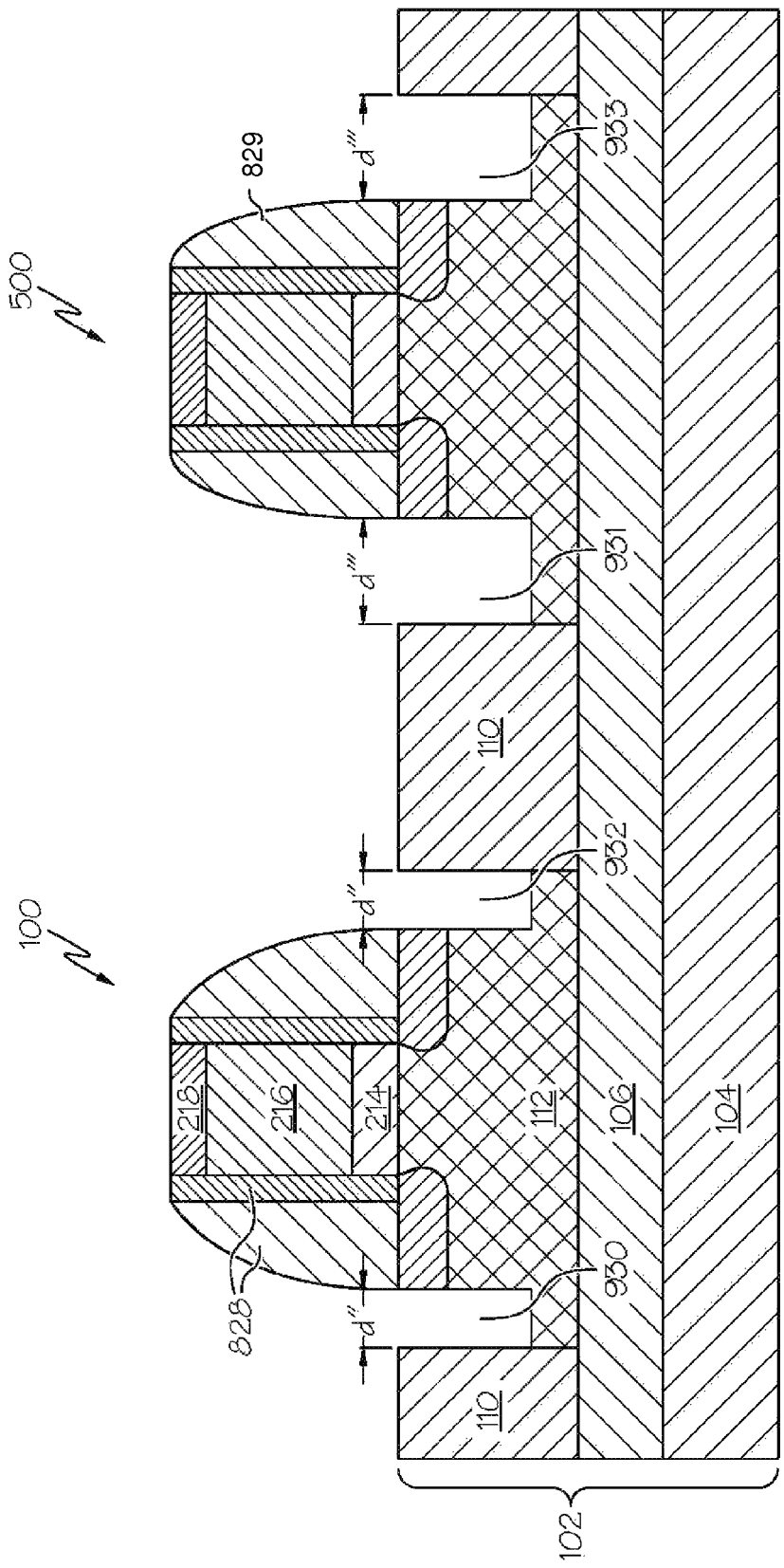
FIG. 9 shows a cross-sectional view of an NFET and a PFET after trenches have been formed in an active region of the NFET and the PFET, where the NFET comprises a differential spacer layer with respect to the PFET according to one embodiment of the present invention.
Figure 10:
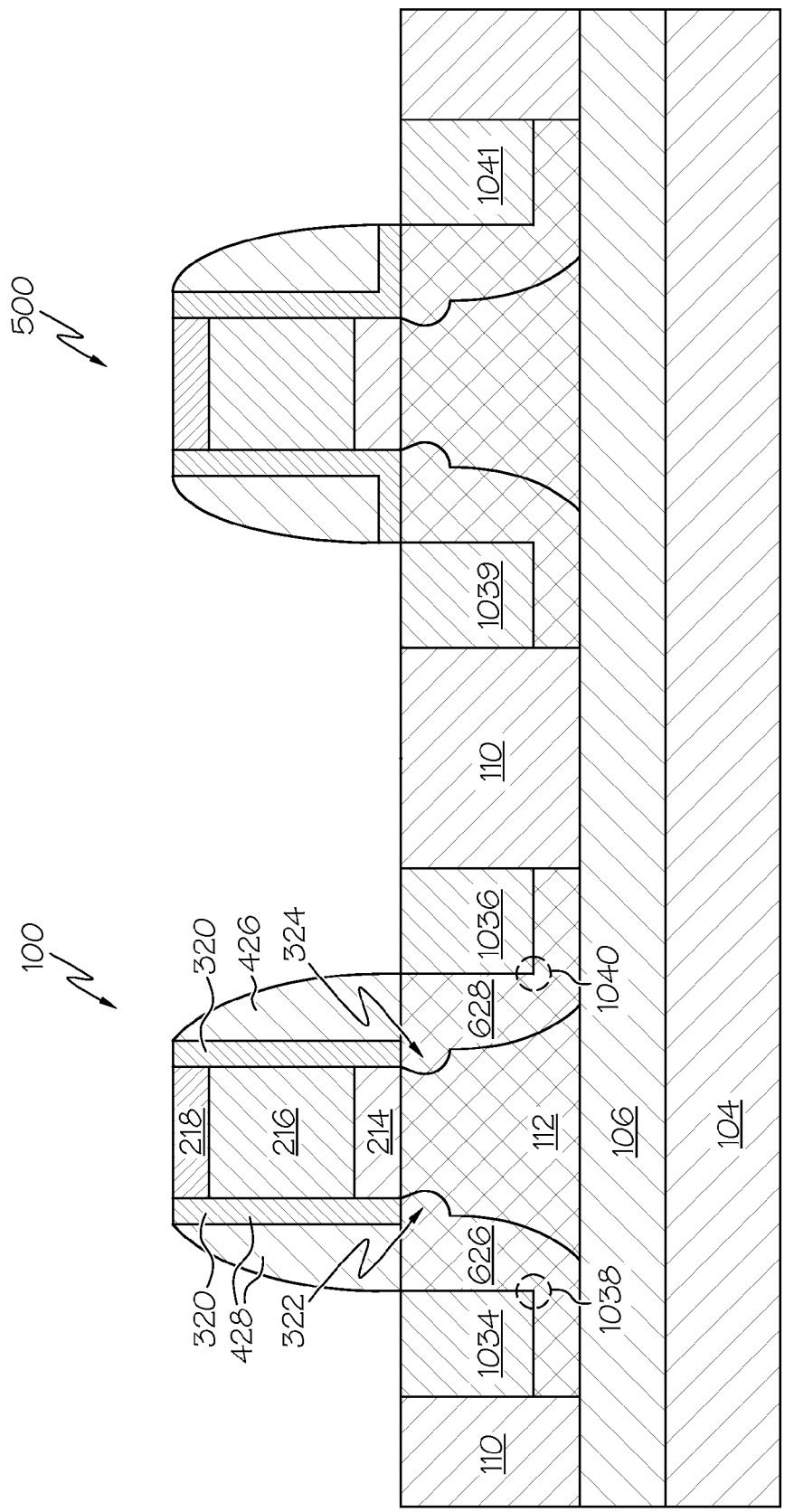
FIG. 10 shows a cross-sectional view of an NFET and a PFET after embedded SiGe has been formed in the trenches of FIG. 9 according to one embodiment of the present invention.

After the formation of the differential gate spacer 828 of the NFET device 100 and the gate spacer 829 of the PFET device 500, the trench etching process of FIG. 5 can be performed as shown in FIG. 9. However, the NFET differential gate spacer 828 reduces the dimension d" of the trenches 930, 932 of the NFET device 100 as compared to the dimension d''' of the trenches 931, 933 of the PFET device 500. Embedded SiGe is then formed according to the process discussed above with respect to FIG. 6. However, as can be seen in FIG. 10, the proximity and total volume of the eSiGe 1034, 1036 to the NFET device channel has been reduced because of the NFET differential gate spacer 828 as compared to the embodiment without the NFET differential gate spacer (FIG. 6). Also, as can be seen in FIG. 10, the eSiGe 1039, 1041 of PFET device 500 comprises a greater area and volume than the eSiGe 1034, 1036 of the NFET device 100. Also, the SiGe/body junctions 1038, 1040 of the NFET device 100 in FIG. 10 has been reduced compared to the SiGe/body junctions 638, 640 in the embodiment without the differential gate spacer 828 (FIG. 6). By reducing the proximity and total volume of the eSiGe to the NFET device channel, current/mobility degradation caused by the stress exhibited by the eSiGe is reduced.

Figure 11:
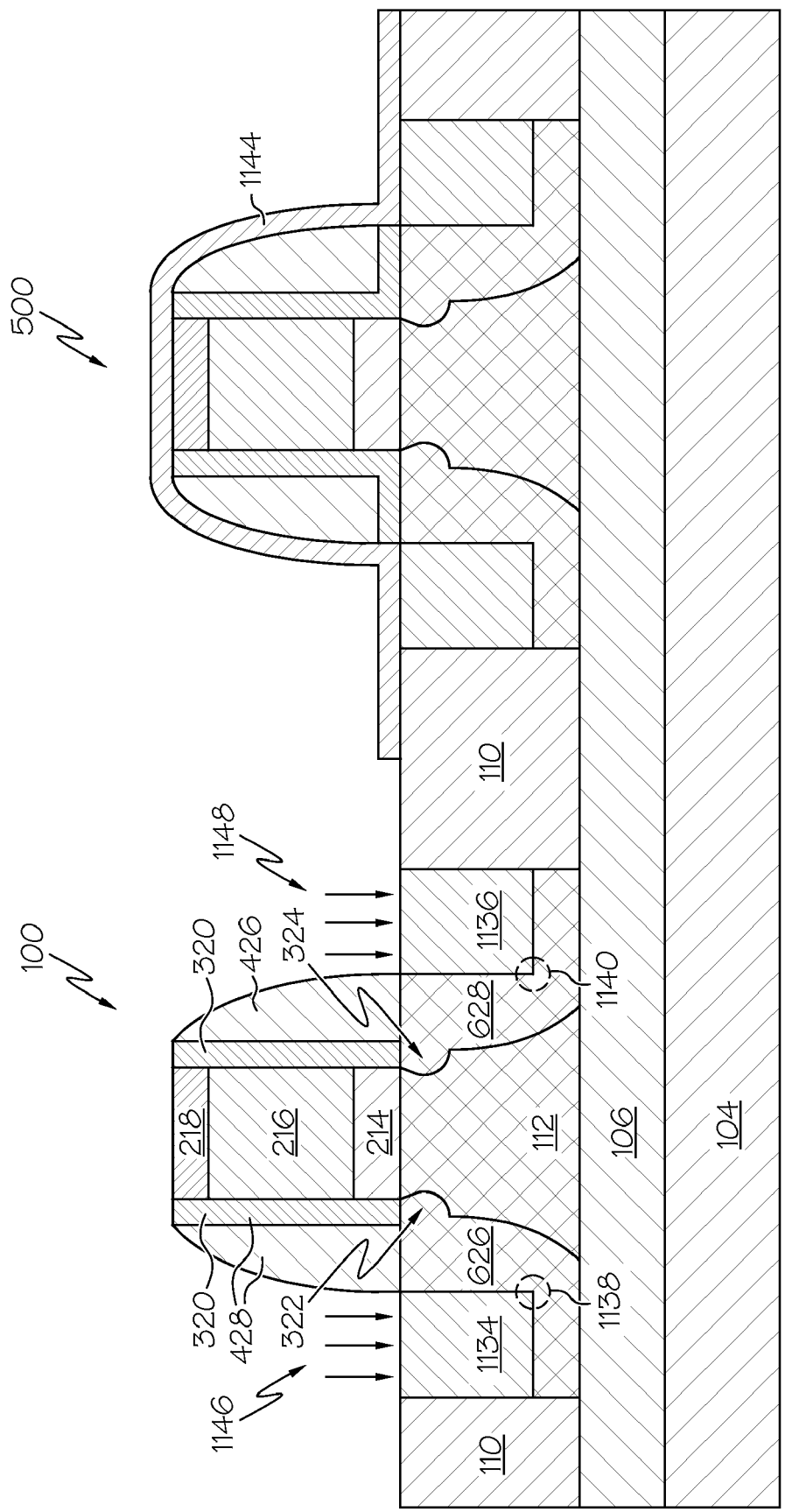
FIG. 11 shows a cross-sectional view of an NFET and a PFET, where the PFET has been masked and an amorphizing implantation process is performed on the NFET according to one embodiment of the present invention.

In yet another embodiment, after the eSiGe 634, 636 is grown within the trenches 503, 532 as discussed above with respect to FIG. 6 an amorphizing implantation process is performed as shown in FIG. 11. For example, a mask 1144 is deposited over the PFET device 500. In particular, a mask comprising photoresist material is deposited over the gate spacer 829 and the source/drain regions of the PFET device 500. An amorphizing implant is then performed as shown by the arrows 1146, 1148. The mask 1144 prevents the amorphizing implant 1146, 1148 from affecting the PFET 500. In one embodiment, the amorphizing implant is typically greater than a $1e^{15}$ cm$^3$ dose of germanium, argon, or xenon. However, various embodiments of the present invention are not limited to this embodiment. It should be noted that the various embodiments of the present invention are not limited to a 0 degree implantation process, and an angled implantation process can alternatively be performed.

The amorphizing implantation process amorphizes the SiGe/body junction areas 1138, 1140, which reduces the stress exhibited by the eSiGe. This improves channel mobility and drive current. It should be noted that the implantation process discussed above is also applicable to the differential spacer embodiment discussed above with respect to FIGS. 7 to 10. For example, after the differential spacer 828 and the trenches 530, 532 are formed and the SiGe 634, 636 is grown within the trenches 530, 532, the PFET 500 can be masked and the amophizing implantation process can be performed as discussed above.

After the processes discussed above with respect to FIGS. 1-6, FIGS. 7-10, and FIG. 11, respectively, conventional fabrication processes can be used to form silicide gates and diffusions. For example, a source silicide contact and a drain silicide contact are formed on both the NFET 100 and the PFET 500 by metallization of exposed semiconductor material. A metal layer can be deposited directly on the semiconductor layer 108 (such as by a blanket deposition). An anneal is then performed to form silicide. The metal is selectively removed leaving the silicide untouched (e.g., through an aqua regia wet etch). In this embodiment, the metal is nickel, cobalt, titanium, or platinum. After the contact areas are formed, the devices 100, 500 are completed in a conventional manner and electrical connections are made between the contact areas and other devices to form an integrated circuit.

Figure 12:
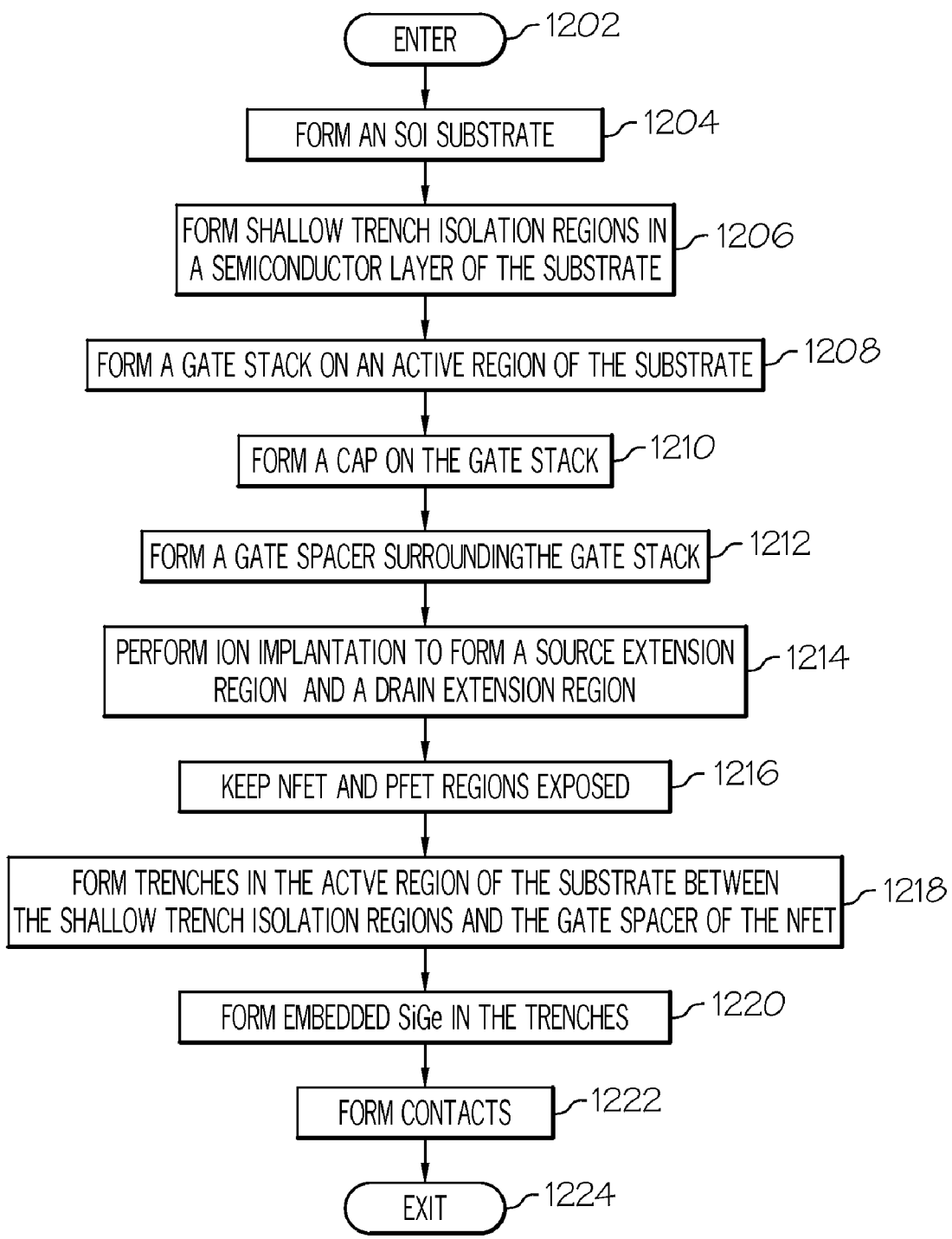
FIGS. 12-14 are operational flow diagrams illustrating various processes of fabricating an eSiGe NFET according to one or more embodiments of the present invention.

FIG. 12 is an operational flow diagram illustrating one process for fabricating an eSiGe NFET according to one embodiment of the present invention. The operational flow diagram begins at step 1202 and flows directly into step 1204. A SOI substrate 102, at step 1204, is formed. The SOI substrate 102 is formed by a handle substrate 104, an overlying buried insulator layer 106, and an overlying semiconductor layer 108. Shallow trench isolation regions 110, at step 1206, are formed in the semiconductor layer 108.

A gate stack 214, 216, at step 1208, is formed on an active region 112 of the semiconductor layer 108. More specifically, a stack of a gate dielectric layer 214 and a gate conductor layer 216 are formed on the active region 112. A gate cap 218, at step 1210, is then formed on the gate conductor layer 216 of the gate stack 219. A gate spacer 428, at step 1212, is then formed surrounding the gate stack 219 and on the semiconductor layer 108. Ion implantation, at step 1214, is performed to form source and drain extension regions 322, 324 in the semiconductor layer 108.

The NFET 100 and PFET 500 are kept exposed, at step 1216, and trenches 530, 532, at step 1218, are formed in the active region 112 between the shallow trench isolation regions 110 and the gate spacer 428. Embedded SiGe, at step 1220, is then epitaxially grown within the trenches 530, 532. As discussed above, a vertical implantation process is then performed to form source and drain regions 626, 628. Contacts (not shown), at step 1220, are then formed on the device 100 and conventional process are performed to complete the device. The control flow then exits, at step 1224.

Figure 13:
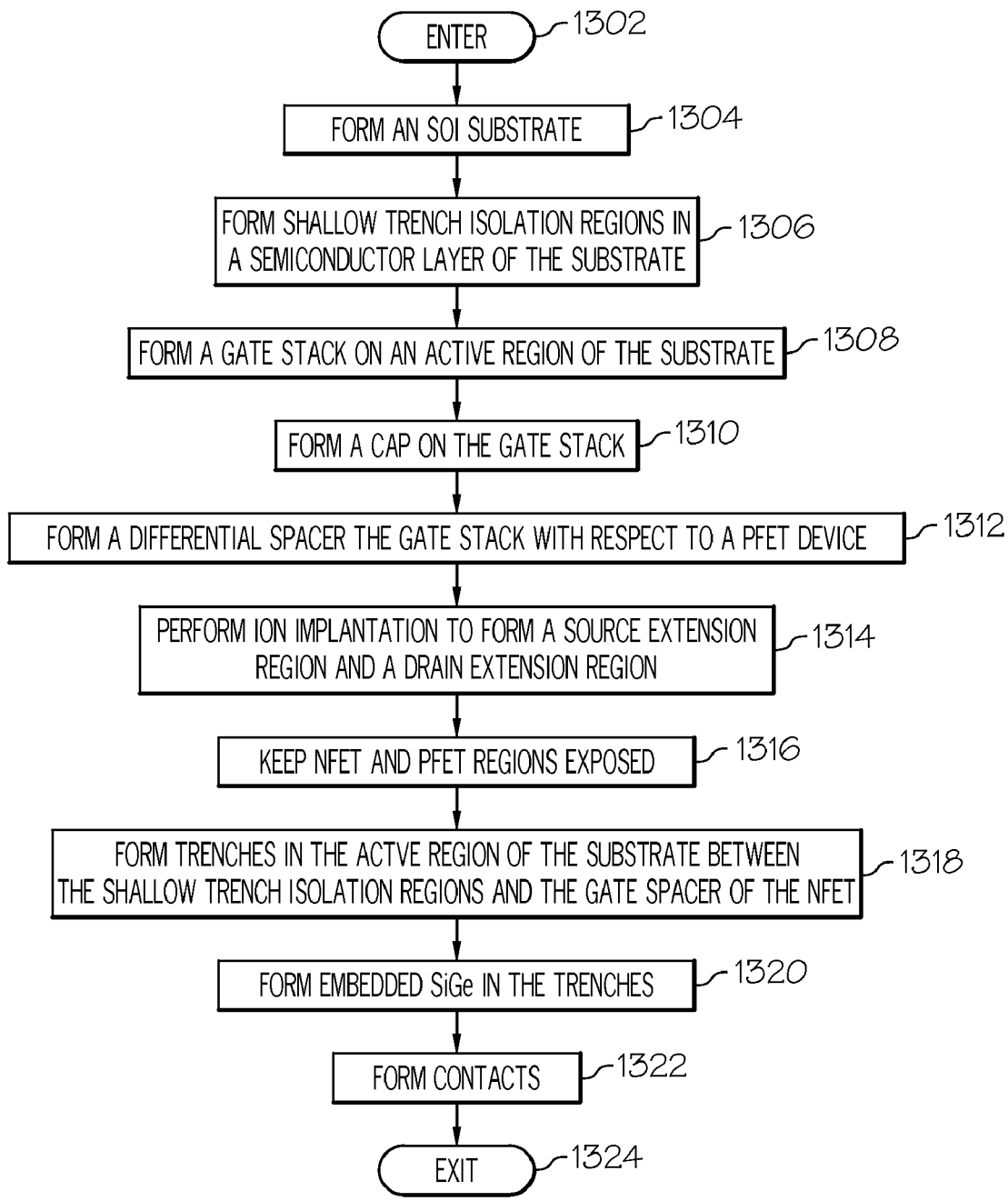

FIG. 13 is an operational flow diagram illustrating another process for fabricating an eSiGe NFET according to one embodiment of the present invention. The operational flow diagram begins at step 1302 and flows directly into step 1304. A SOI substrate 102, at step 1304 is formed. The SOI substrate 102 is formed by a handle substrate 104, an overlying buried insulator layer 106, and an overlying semiconductor layer 108. Shallow trench isolation regions 110, at step 1306, are formed in the semiconductor layer 108.

A gate stack 214, 216, at step 1308, is formed on an active region 112 of the semiconductor layer 108. More specifically, a stack of a gate dielectric layer 214 and a gate conductor layer 216 are formed on the active region 112. A gate cap 218, at step 1310, is then formed on the gate conductor layer 216 of the gate stack. A differential spacer 828, at step 1312, is then formed surrounding the gate stack 214, 216 and on the semiconductor layer 108, where a spacer is differential (different than) to a gate spacer 929 of a corresponding PFET device 500. Ion implantation, at step 1314, is performed to form source and drain extension regions 322, 324 in the semiconductor layer 108.

The NFET 100 and PFET 500 are kept exposed, at step 1316, and trenches 530, 532, at step 1318, are formed in the active region 112 between the shallow trench isolation regions 110 and the gate spacer 428. Embedded SiGe, at step 1320, is then epitaxially grown within the trenches 530, 532. As discussed above, a vertical implantation process is then performed to form source and drain regions 626, 628. Contacts (not shown), at step 1320, are then formed on the device 100 and conventional process are performed to complete the device. The control flow then exits, at step 1324.

Figure 14:
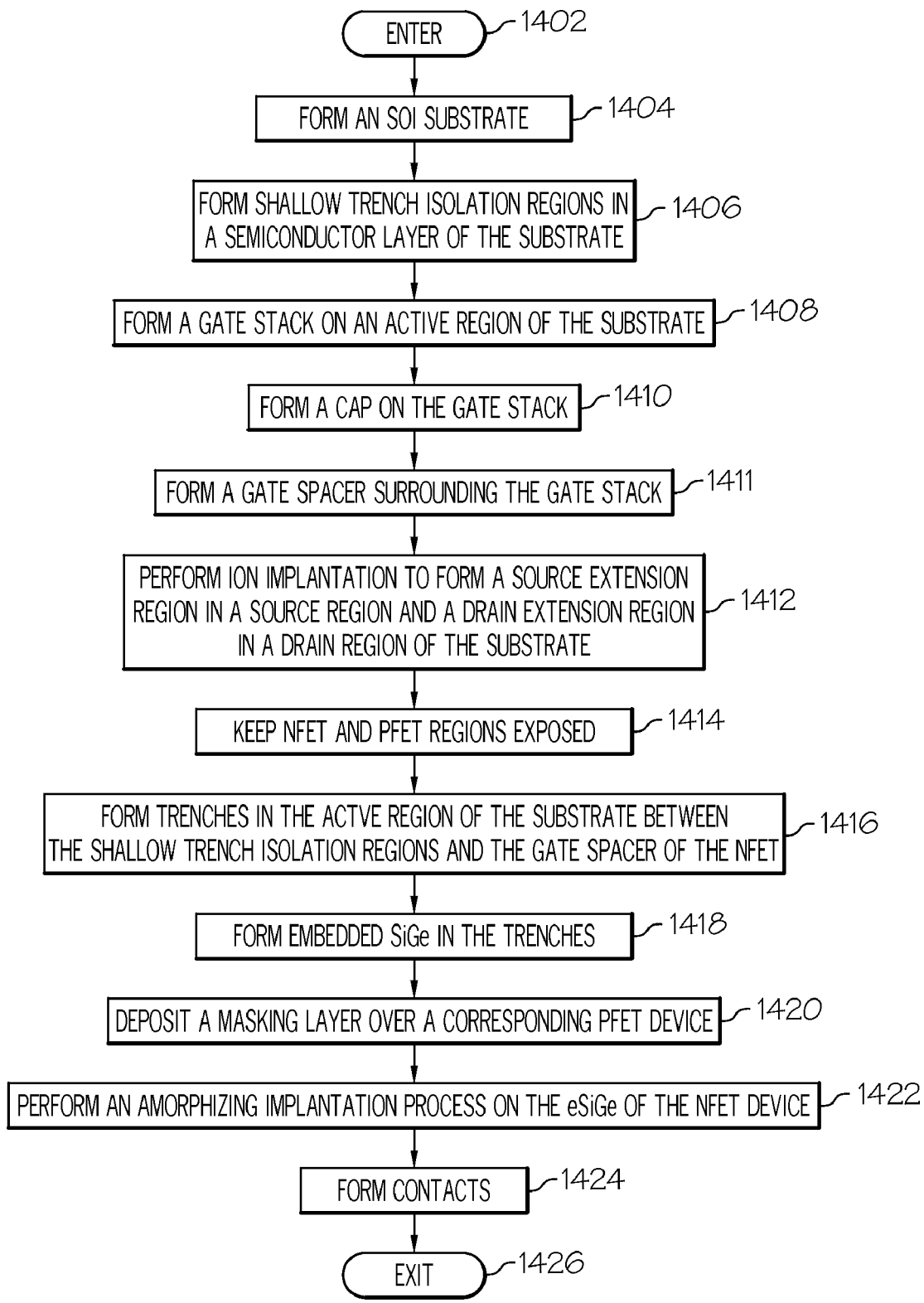

FIG. 14 is an operational flow diagram illustrating one process for fabricating an eSiGe NFET according to one embodiment of the present invention. The operational flow diagram begins at step 1402 and flows directly into step 1404. A SOI substrate 102, at step 1404, is formed. The SOI substrate 102 is formed by a handle substrate 104, an overlying buried insulator layer 106, and an overlying semiconductor layer 108. Shallow trench isolation regions 110, at step 1406, are formed in the semiconductor layer 108.

A gate stack 214, 216, at step 1408, is formed on an active region 112 of the semiconductor layer 108. More specifically, a stack of a gate dielectric layer 214 and a gate conductor layer 216 are formed on the active region 112. A gate cap 218, at step 1410, is then formed on the gate conductor layer 216 of the gate stack. A gate spacer 428, at step 1411, is then formed on the gate stack 214, 216 and on the semiconductor layer 108. Ion implantation, at step 1412, is performed to form source and drain extension regions 322, 324 in the semiconductor layer 108.

The NFET source/drain regions 326, 328 are kept exposed, at step 1414, and trenches 530, 532, at step 1416, are formed in the active region 112 between the shallow trench isolation regions 110 and the gate spacer 428. Embedded SiGe, at step 1418, is then epitaxially grown within the trenches 530, 532. An implantation mask 1144, at step 1420, is formed over a corresponding PFET device 500. An amorphizing implantation process, at step 1422, is then performed on the eSiGe regions 634, 636 of the NFET device 100. Contacts (not shown), at step 1424, are then formed on the NFET device 100 and conventional processes are performed to complete the NFET device 100. The control flow then exits at step 1426.

As can be seen from the discussion above, various embodiments of the present invention provide an eSiGe NFET with a reduced floating body effect. An eSiGe NFET incorporates an eSiGe source/drain while minimizing the impact from the stress. In one or more embodiments, the NFET regions are exposed during the eSiGe trench etching process and eSiGe is grown within the NFET source/drain diffusion regions. The SiGe/body junction reduces the floating body effects such as variability and drain-induced barrier lowering (DIBL). In addition, other embodiments reduce the proximity and total volume of the eSiGe to NFET device channel. This reduces NFET current/mobility degradation. One or more embodiments, mask the P regions and apply an amorphizing implant (typically, but not limited to, greater than a $1e^{15}$ $cm^3$ dose) of germanium, argon, or xenon to relax eSiGe stress in NFET regions. This improves channel mobility and drive current.

It should be noted that some features of the present invention may be used in an embodiment thereof without use of other features of the present invention. As such, the foregoing description should be considered as merely illustrative of the principles, teachings, examples and exemplary embodiments of the present invention, and not a limitation thereof.

It should be understood that these embodiments are only examples of the many advantageous uses of the innovative teachings herein. In general, statements made in the specification of the present application do not necessarily limit any of the various claimed inventions. Moreover, some statements may apply to some inventive features but not to others.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The methods as discussed above are used in the fabrication of integrated circuit chips.

The resulting integrated circuit chips can be distributed by the fabricator in raw wafer form (that is, as a single wafer that has multiple unpackaged chips), as a bare chip, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard, or other input device, and a central processor.

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention.

What is claimed is:

1. A method for fabricating an n-type field effect transistor of a semiconductor device, the method comprising:

forming a gate stack of an n-type field effect transistor on an active region of a silicon-on-insulator substrate of a semiconductor device, wherein the active region is within a semiconductor layer and is doped with a p-type dopant, and wherein the semiconductor device includes at least one p-type field effect transistor;

forming a gate spacer surrounding the gate stack of the n-type field effect transistor, etching the gate spacer, wherein the etching forms a differential gate spacer surrounding the gate stack of the n-type field effect transistor, and wherein the differential gate spacer comprises at least one dimension that is greater than a corresponding dimension of a gate spacer formed on, and surrounding, a gate stack of a corresponding p-type field effect transistor of the semiconductor device;

forming at the n-type field effect transistor of the semiconductor device, while maintaining exposed a region reserved for a source region and a region reserved for a drain region, a first trench having a dimension d" in the region reserved for the source region and a second trench having a dimension d" in the region reserved for the drain region, wherein the first trench is formed between a first shallow trench isolation region in the semiconductor layer and a first outer wall of the differential gate spacer, and wherein the second trench is formed between a second shallow trench isolation region in the semiconductor layer and a second outer wall of the differential gate spacer;

forming at the p-type field effect transistor of the semiconductor device, while maintaining exposed a region reserved for a source region and a region reserved for a drain region, a third trench having a dimension d'" in the region reserved for the source region and a fourth trench having a dimension d'" in the region reserved for the drain region, wherein dimension d'" is larger than dimension d", wherein the third trench is formed between the second shallow trench isolation region and a first outer wall of the gate spacer of the p-type field effect transistor, and wherein the fourth trench is formed between a third shallow trench isolation region in the semiconductor layer and a second outer wall of the gate spacer of the p-type field effect transistor; and epitaxially growing, while maintaining exposed the regions of the n-type field effect transistor reserved for the source and drain regions, respectively, silicon germanium within the first trench and the second trench of the n-type field effect transistor.

2. The method of claim 1, wherein the first, second, and third shallow trench isolation regions comprise
a dielectric material.

3. The method of claim 1, wherein forming the gate stack comprises:
forming a gate dielectric layer on an upper portion of the active region.

4. The method of claim 3, wherein forming the gate stack comprises:
forming a gate conductor layer on top of the gate dielectric layer.

5. The method of claim 4, further comprising:
forming a polysilicon layer over the gate conductor layer.

* * * * *